(12) United States Patent  
Hong et al.

(10) Patent No.: US 8,975,507 B2
(45) Date of Patent: Mar. 10, 2015

(54) SOLAR CELL MODULE

(75) Inventors: Jongkyoung Hong, Seoul (KR); Taeyoon Kim, Seoul (KR); Eunjoo Lee, Seoul (KR); Seiyoung Mun, Seoul (KR); Jemin Yu, Seoul (KR); Taeki Woo, Seoul (KR)

(73) Assignee: LG Electronics Inc., Seoul (KR)

( * ) Notice: Subject to any disclaimer, the term of this patent is extended or adjusted under 35 U.S.C. 154(b) by 375 days.

(21) Appl. No.: 13/365,009

(22) Filed: Feb. 2, 2012

(65) Prior Publication Data

US 2012/0125412 A1 May 24, 2012

(30) Foreign Application Priority Data

Jun. 8, 2011 (KR) .................. 10-2011-0055022

(51) Int. Cl.
| H01L 31/042 | (2014.01) |
| H01L 23/34 | (2006.01) |
| H01L 31/05 | (2014.01) |
| H01L 31/0224 | (2006.01) |

(52) U.S. Cl.
CPC .... *H01L 31/0504* (2013.01); *H01L 31/022425* (2013.01); *Y02E 10/50* (2013.01); *H01L 31/0512* (2013.01)
USPC .......................... 136/244; 257/723

(58) Field of Classification Search
CPC .................. H01L 31/022425; H01L 31/0512; H01L 31/0504; Y02E 10/50

USPC .......................... 136/244; 257/723
See application file for complete search history.

(56) References Cited

U.S. PATENT DOCUMENTS

| 5,609,694 | A | * | 3/1997 | Asai ........................ 136/256 |
| 2007/0256733 | A1 | * | 11/2007 | Karakida et al. ............. 136/256 |
| 2007/0295381 | A1 | * | 12/2007 | Fujii et al. .................. 136/244 |
| 2008/0121265 | A1 | * | 5/2008 | Hishida et al. .............. 136/244 |
| 2009/0038675 | A1 | | 2/2009 | Tsunomura et al. |
| 2009/0266396 | A1 | * | 10/2009 | Niira et al. ................. 136/244 |
| 2010/0275965 | A1 | | 11/2010 | Lee et al. |
| 2011/0088746 | A1 | | 4/2011 | Hong et al. |

FOREIGN PATENT DOCUMENTS

| CN | 102044579 A | 5/2011 |
| EP | 2 086 022 A1 | 8/2009 |
| EP | 2 136 407 A2 | 12/2009 |
| EP | 2 234 181 A2 | 9/2010 |

* cited by examiner

*Primary Examiner* — Tamir Ayad
(74) *Attorney, Agent, or Firm* — Birch, Stewart, Kolasch & Birch, LLP

(57) ABSTRACT

A solar cell module includes a plurality of solar cells, whereby in each solar cell a conductive adhesive film includes a first portion contacting a back electrode current collector and a second portion contacting a back electrode, and a length of the conductive adhesive film is longer than a length of the back electrode current collector, and the second portion of the conductive adhesive film is positioned at the outside of the back electrode current collector in a length direction of the back electrode current collector.

12 Claims, 8 Drawing Sheets

SOLAR CELL MODULE

CROSS-REFERENCE TO RELATED APPLICATION

This application claims priority to and the benefit of Korean Patent Application No. 10-2011-0055022 filed in the Korean Intellectual Property Office on Jun. 8, 2011, the entire content of which is incorporated herein by reference.

BACKGROUND OF THE INVENTION

1. Field of the Invention

Embodiments of the invention relate to a solar cell module for electrically connecting adjacent solar cells to each other by an interconnector.

2. Description of the Related Art

Photovoltaic power generation that converts light energy to electrical energy using a photoelectric conversion effect is widely used as a means that obtains non-polluting and renewable energy. With improvements of a photoelectric conversion efficiency of a solar cell, a photovoltaic power generation system using a plurality of solar cell modules may be installed in individual homes.

In a solar cell module, in order to output electric power generated by a solar cell to the outside, a method is used to take a current through a power line of a junction box by connecting a conductor, for example, an interconnector connected to a positive electrode and a negative electrode of the solar cell to a lead line, and connecting the lead line to the junction box so as take out power to the outside of a solar cell module.

SUMMARY OF THE INVENTION

In an embodiment of the invention, a solar cell module includes, a plurality of solar cells, each solar cell including a substrate, a back electrode including a plurality of openings that expose portions of a back surface of the substrate and positioned at the back surface of the substrate, and a back electrode current collector positioned at a location of at least one of the plurality of openings; a plurality of interconnectors for electrically connecting adjacent solar cells; and a conductive adhesive film positioned between the interconnector and the back electrode current collector, and electrically connecting the interconnector and the back electrode current collector, wherein the conductive adhesive film includes a first portion contacting the back electrode current collector and a second portion contacting the back electrode, and wherein a length of the conductive adhesive film is longer than a length of the back electrode current collector, and the second portion of the conductive adhesive film is positioned at the outside of the back electrode current collector in a length direction of the back electrode current collector.

As an example, the back electrode and the back electrode current collector may be made of different materials, and a thickness of the back electrode may be greater than a thickness of the back electrode current collector. In this instance, a difference between the thickness of the back electrode and the thickness of the current collector may be 5 μm to 25 μm.

A thickness of the first portion of the conductive adhesive film may be greater than that of the second portion thereof or may be substantially the same as that of the second portion.

When the thickness of the first portion of the conductive adhesive film is greater than the thickness of the second portion of the conductive adhesive film, a difference between the thickness of the first portion and the thickness of the second portion may be 5 μm to 25 μm.

A width of the conductive adhesive film may be greater than a width of the back electrode current collector. In this instance, the second portion of the conductive adhesive film may be further positioned at the outside of the back electrode current collector in a width direction of the back electrode current collector.

As another example, the back electrode and the back electrode current collector may be made of different materials, and a thickness of the back electrode may be substantially the same as a thickness of the back electrode current collector. In this instance, the thickness of the first portion of the conductive adhesive film and the thickness of the second portion of the conductive adhesive film may be substantially the same.

A width of the conductive adhesive film may be greater than a width of the back electrode current collector. In this instance, the second portion of the conductive adhesive film may be positioned at the outside of the back electrode current collector in a width direction of the back electrode current collector.

A length and a width of the conductive adhesive film may be formed greater than a length and a width of the back electrode current collector. In this instance, the second portion of the conductive adhesive film may be positioned at the outside of the back electrode current collector in a length direction and a width direction of the back electrode current collector.

A portion of the back electrode is interposed between the back electrode current collector and the second portion of the conductive adhesive film. In this instance, a width of the conductive adhesive film may be about the same as a width of the current collector, or a width of the conductive adhesive film may be greater than a width of the current collector.

When the back electrode is made of aluminum, the interconnector is not adhered with the back electrode by a conventional tabbing operation performed with a soldering method using a flux. Therefore, because the interconnector is electrically connected to only the back electrode current collector, a current collection efficiency is deteriorated.

However, a conductive adhesive film can be adhered to the back electrode. Therefore, when at least one of a length and a width of a conductive adhesive film are formed greater than a length and a width of the back electrode current collector, the conductive adhesive film includes a second portion contacting with the back electrode, and thus, electric charges are collected through a first portion contacting with the back electrode current collector and a second portion contacting with the back electrode in the conductive adhesive film. Therefore, a current collection efficiency is improved.

Further, in a state in which a step occurs due to a thickness difference between the back electrode and the back electrode current collector, because the interconnector does not contact with back electrode current collector in a portion in which the step occurs, a non-bonding portion occurs, and thus, a current collection efficiency is further deteriorated.

However, in the embodiment using a conductive adhesive film, because the conductive adhesive film is filled in space between the interconnector and the back electrode current collector in a portion in which the step occurs, a non-bonding portion does not occur in the back electrode current collector and the interconnector. Therefore, a current collection efficiency can be prevented from being deteriorated.

When the interconnector is adhered with the back electrode current collector so that a portion of a conductive particle of a conductive adhesive film is injected into the inside of at least one of the interconnector and the back electrode current collector, a contact area between conductive particles and the interconnector and/or conductive particles and the back electrode current collector increases, and thus, a current transfer efficiency and reliability are improved.

Further, a tabbing operation can be performed at a low temperature due to use of a conductive adhesive film.

That is, a conventional tabbing operation using a flux is performed at a temperature of about 220° C. or more, however because a tabbing operation using a conductive adhesive film is a bonding method instead of a soldering method using a flux, a tabbing operation can be performed at a temperature of 180° C. or fewer.

Therefore, a substrate bowing phenomenon occurring when performing a tabbing operation remarkably decreases, compared with a conventional case.

For example, when a thickness of the substrate is 200 μm, a substrate bowing amount is about 2.1 mm or more according to a conventional tabbing method of melting a flux using hot air, but a substrate bowing amount is about 0.5 mm according to a tabbing method using a conductive adhesive film according to an embodiment of the invention.

Here, in a lower surface of the substrate, a bowing amount occurs due to a height difference between a central portion of the substrate and a peripheral portion of the substrate.

As a thickness of the substrate becomes thin, a substrate bowing phenomenon occurs more pronouncedly. For example, when a thickness of the substrate is 80 μm, a substrate bowing amount is about 14 mm or more according to a conventional tabbing method of melting a flux using hot air, but a substrate bowing amount is about 1.8 mm according to a tabbing method using a conductive adhesive film according to an embodiment of the invention.

When the substrate bowing amount overpasses a predetermined range, for example 2.5 mm, in a lamination process to be performed later, there is a problem in that a substrate crack occurs or a bubble occurs within a module, and thus, when using a conventional tabbing method, it is impossible to form a thickness of the substrate to be thin.

However, in a tabbing method using a conductive adhesive film according to an embodiment of the invention, because a substrate bowing amount can be remarkably reduced, compared with a conventional case, a substrate of a thin thickness can be used.

For example, when a tabbing method using a conductive adhesive film is used, a substrate having a thickness of 80 μm to 180 μm can be used. Therefore, due to thickness decrease of the substrate, a material cost can be reduced.

Further, in a conventional tabbing method using a flux, there is a problem in that an output of a solar cell module is deteriorated due to a problem that a crack occurs in an interface between a current collector for a back electrode or a current collector for a front electrode and an interconnector, and a peeling phenomenon occurs between several materials within a shoulder of an interconnector, but in a tabbing method using a conductive adhesive film according to embodiments of the invention, the above problem can be solved. Therefore, the reliability of a solar cell module can be sustained for a longer period.

Further, because a flux is not used, mis-alignment can be reduced or prevented while sustaining uniform adhesive strength, and thus, decrease in output can be suppressed.

DETAILED DESCRIPTION OF THE EMBODIMENTS

Figure 1:
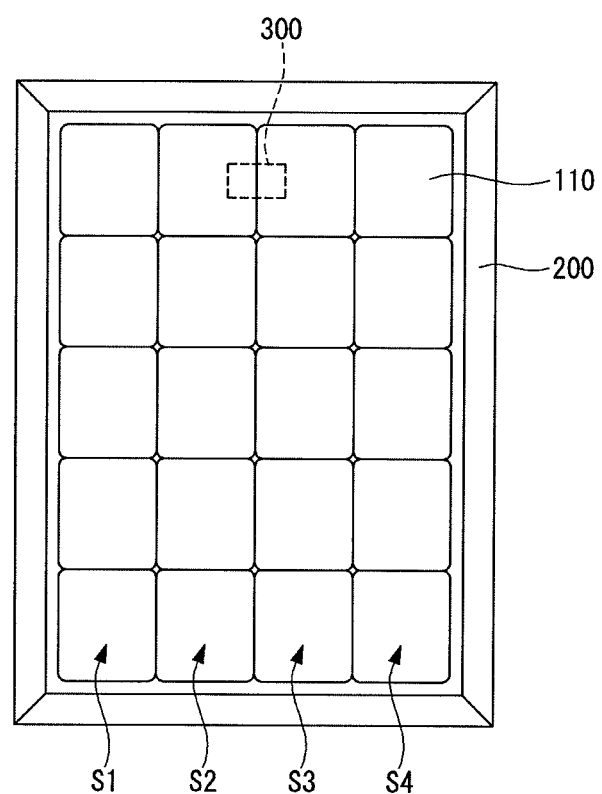
FIG. 1 is a top plan view illustrating a solar cell module according to an embodiment of the invention.

In the following detailed description, only certain embodiments of the invention have been shown and described, simply by way of illustration. As those skilled in the art would realize, the described embodiments may be modified in various different ways, all without departing from the spirit or scope of the embodiments of the invention. Accordingly, the drawings and description are to be regarded as illustrative in nature and not restrictive. Like reference numerals designate like elements throughout the specification.

In the drawings, the thickness of layers, films, panels, regions, etc., are exaggerated for clarity. When any element, such as a layer, film, region, or plate, is referred to as being positioned on another element, it refers to the element being directly on the other element or above the other element with at least one intervening element. In contrast, when an element is referred to as being "directly on" another element, there are no intervening elements present.

Further, when any element is referred to as being "entirely" formed on another element, it refers to the element being formed on an entire surface of the other element and not being formed in an edge portion.

Hereinafter, an embodiment of the invention will be described with reference to the attached drawings.

Figure 2:
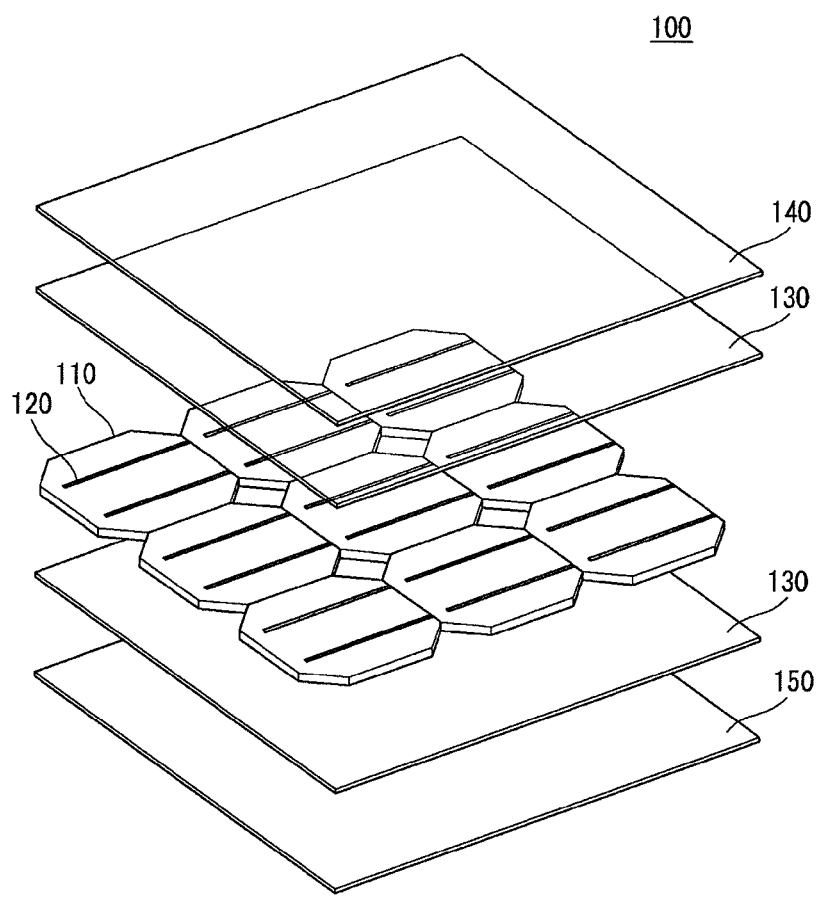
FIG. 2 is an exploded perspective view illustrating the solar cell panel shown in FIG. 1 according to an embodiment of the invention.
Figure 3:
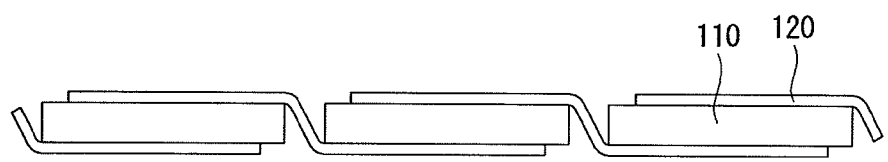
FIG. 3 is a side elevational view illustrating the solar cell panel shown in FIG. 1 according to an embodiment of the invention.

FIG. 1 is a top plan view illustrating a solar cell module according to an embodiment of the invention, FIG. 2 is an exploded perspective view illustrating the solar cell panel shown in FIG. 1 according to an embodiment of the invention, and FIG. 3 is a side elevational view illustrating the solar cell panel shown in FIG. 1 according to an embodiment of the invention.

Referring to FIGS. 1 to 3, the solar cell module according to an embodiment of the invention comprises a solar cell panel 100.

The solar cell panel 100 comprises a plurality of solar cells 110, an interconnector 120 for electrically connecting adjacent solar cells 110, a protective film (ethylene vinyl acetate (EVA)) 130 for protecting the solar cells 110, a transparent member 140 disposed on the protective film 130 at a light receiving surface side of the solar cells 110, and a back sheet 150 of an opaque material disposed at a lower part of the protective film 130 at a side opposite to the light receiving surface side.

The solar cell module 100 comprises a frame 200 for receiving components to be formed as one body by a lamination process, and a junction box 300 for collecting electric power generated in the solar cells 110.

The back sheet 150 prevents moisture from penetrating through a back surface of the solar cell module 100, thereby protecting the solar cell 110 from an outside environment. The back sheet 150 may have a multi-layered structure such as a layer for preventing moisture and oxygen from penetrating, a layer for preventing chemical corrosion, and a layer having insulation characteristics.

When the protective films 130 are disposed at each of an upper part and a lower part of the solar cells 110, the protective films 130 are formed as one body with the solar cells 110 by a lamination process, prevent corrosion due to penetration of moisture, and protect the solar cell 110 from an impact. The protective film 130 is made of a material such as ethylene vinyl acetate (EVA).

The transparent member 140 positioned on the protective film 130 is made of tempered glass having high transmittance and an excellent damage prevention function. In this instance, the tempered glass may be low iron tempered glass having a low iron content. In order to enhance a scattering effect of light, the transparent member 140 has an inner side surface on which an embossing processing is performed.

Hereinafter, an electrical connection structure of a solar cell panel provided in a solar cell module according to an embodiment of the invention will be described in detail with reference to FIGS. 2 and 3. FIG. 3 includes a gap between the solar cells 110 that is shown enlarged, but the solar cells 110 are disposed at a predetermined gap, for example, a narrow gap within about 3 mm between adjacent solar cells.

A plurality of solar cells 110 provided in the solar cell panel 100 are disposed in a plurality of string forms. In this instance, a string refers to a plurality of solar cells being electrically connected and arranged in a line. Therefore, the solar cell panel 100 shown in FIG. 1 has 4 strings, for example, a first string to a fourth string S1, S2, S3, and S4.

A plurality of solar cells 110 arranged at each of the strings S1-S4 are electrically connected by the interconnector 120.

In this instance, the interconnector 120 is made of a conductive metal of a leadless (or essentially lead-free) material containing a lead content of 1,000 ppm or less, or further comprises a solder of a lead material coated at a surface of the conductive metal.

A current collector 114 for a front electrode (also referred to as a front electrode current collector 114 or as a current collector 117) of one of a plurality of solar cells 110 adjacently disposed in a vertical direction within one string, for example the first string S1, is electrically connected by the interconnector 120 to a current collector 117 for a back electrode (also referred to as a back electrode current collector 117 or as a current collector 117) of an adjacent solar cell.

A lead line that connects an interconnector positioned at an end portion of adjacent strings may be made of a conductive metal of a leadless (or essentially lead-free) material containing a lead ingredient of 1,000 ppm or fewer and a solder of a lead material coated at a surface of the conductive metal, or may be made of only a conductive metal of a leadless (or essentially lead-free) material containing a lead ingredient of 1,000 ppm or fewer, similarly to the interconnector 120.

Hereinafter, a bonding structure between an interconnector and a current collector for a back electrode of a solar cell will be described in detail with reference to the attached drawings.

Figure 4:
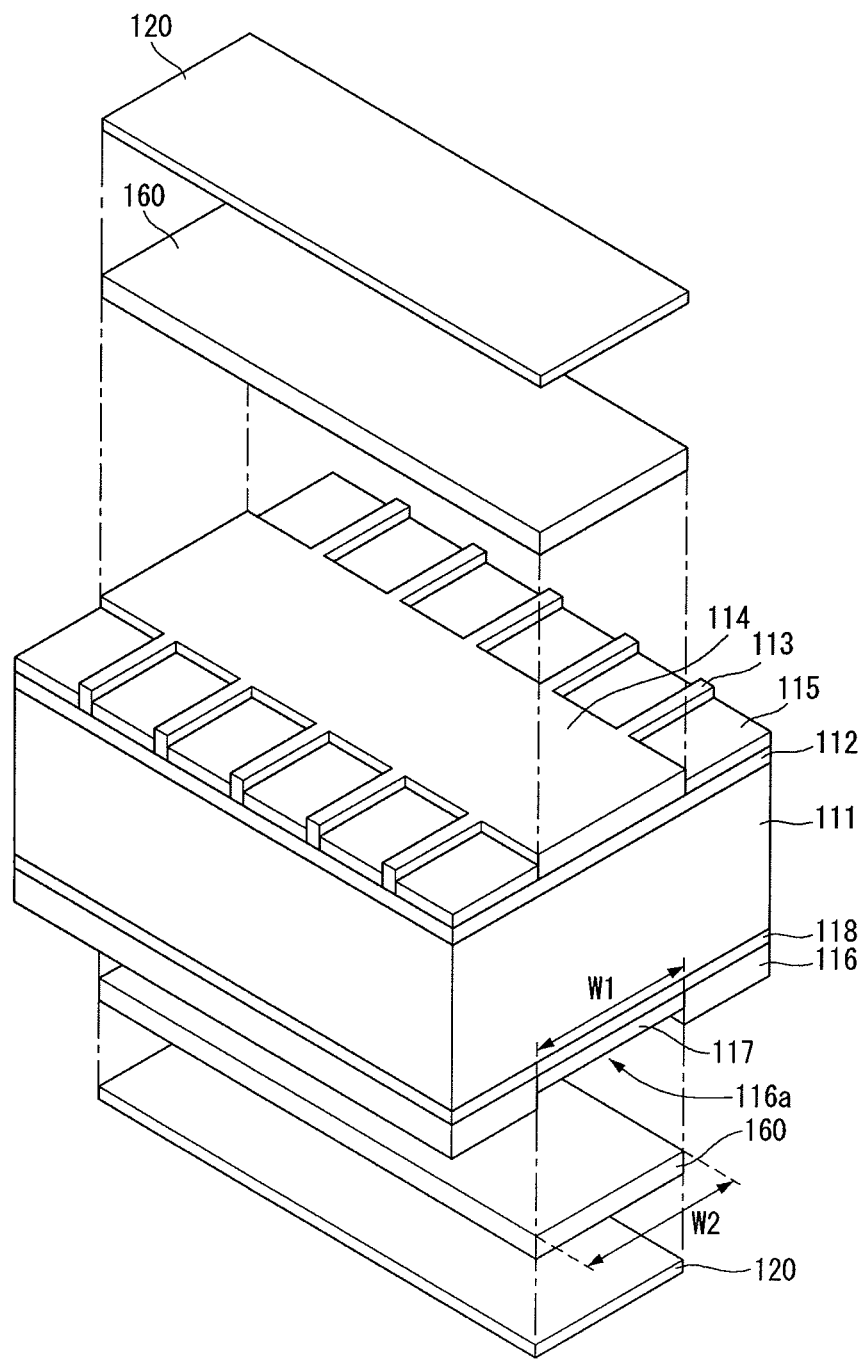
FIG. 4 is an exploded perspective view illustrating a major portion of a solar cell panel according to a first example embodiment of the invention.
Figure 5:
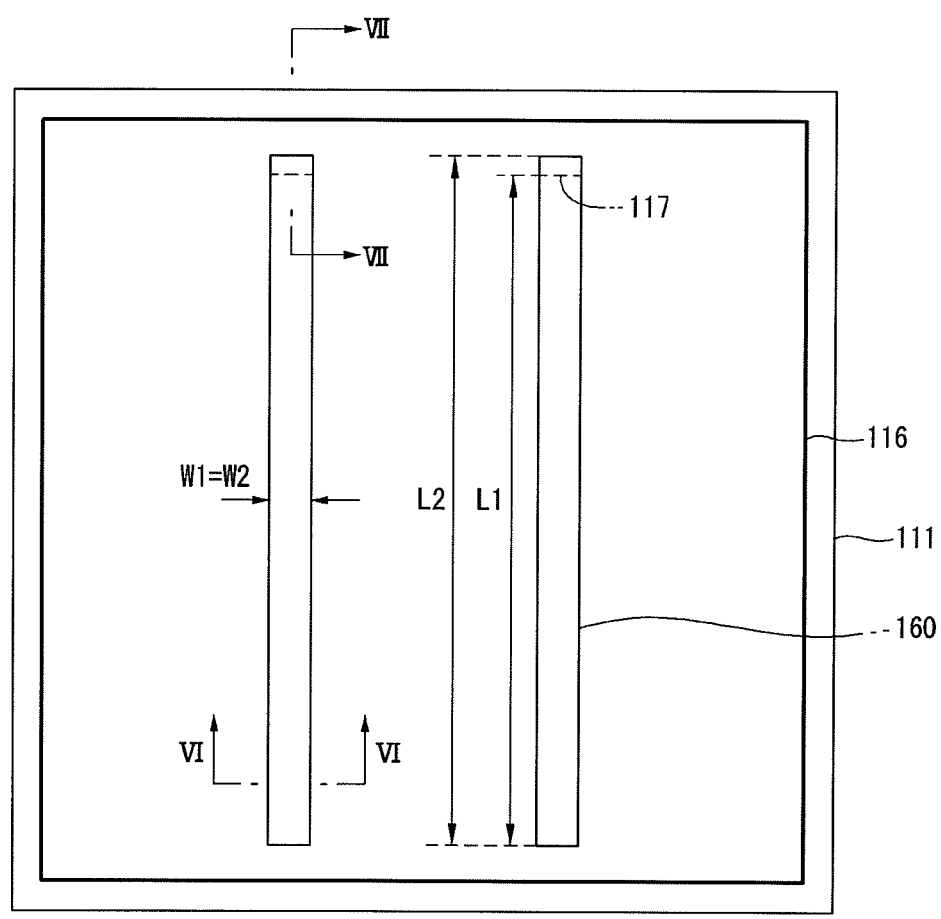
FIG. 5 is a top plan view illustrating an assembly state of a back surface of a substrate in the solar cell panel of FIG. 4 according to an embodiment of the invention.
Figure 6:
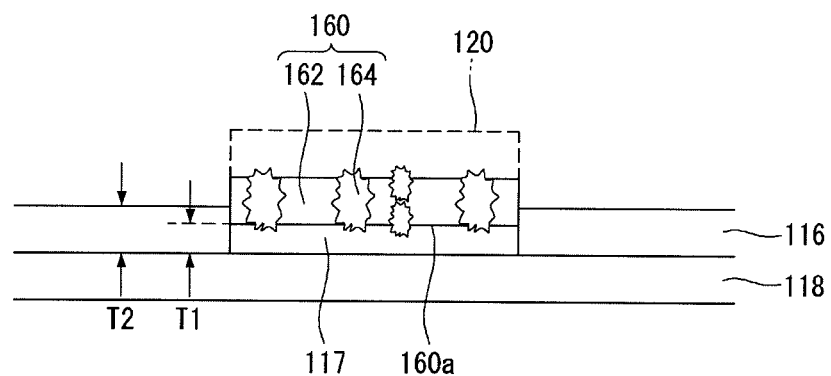
FIG. 6 is a cross-sectional view illustrating the back surface of the substrate taken along line VI-VI of FIG. 5 according to an embodiment of the invention.
Figure 7:
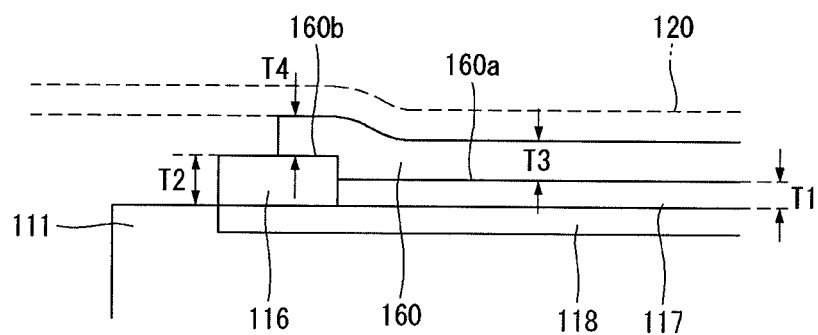
FIG. 7 is a cross-sectional view illustrating the back surface of the substrate taken along line VII-VII of FIG. 5.

FIG. 4 is an exploded perspective view illustrating a major portion of a solar cell panel according to a first embodiment of the invention, and FIG. 5 is a top plan view illustrating an assembly state of a back surface of a substrate in the solar cell panel of FIG. 4 according to an embodiment of the invention. FIG. 6 is a cross-sectional view illustrating the back surface of the substrate taken along line VI-VI of FIG. 5 according to an embodiment of the invention, and FIG. 7 is a cross-sectional view illustrating the back surface of the substrate taken along line VII-VII of FIG. 5 according to an embodiment of the invention.

The solar cell 110 according to an embodiment of the invention comprises a substrate 111, an emitter 112 positioned at a first surface of the substrate 111, i.e., a front surface to which light is incident, a plurality of front electrodes 113 and a current collector 114 collectively referred to as a plurality of front electrode units and positioned on the emitter 112, a reflection prevention film 115 (also referred to as an antireflection film 115) positioned on the emitter 112 at which the front electrode 113 and the current collector 114 are not positioned, and a back electrode 116 and a current collector 117 collectively referred to as a plurality of back electrode units and positioned at a second surface of the substrate 111, i.e., at a back surface of the substrate 111 opposite to the first surface.

The solar cell 110 further comprises a back surface field (BSF) portion formed between the back electrode 116 and the substrate 111. A back surface field portion 118 is an area, for example, a p+ area in which the same conductive type impurities as that of the substrate 111 are doped with a concentration higher than that of the substrate 111.

The back surface field portion 118 operates as a potential barrier in a back surface of the substrate 111. Therefore, by decreasing recombination of electrons and holes at the back surface side of the substrate 111 so that amount of disappearance of electrons and holes are decreased, an efficiency of the solar cell is improved.

The substrate 111 is a semiconductor substrate made of silicon of a first conductive type, for example, a p-type conductive type. In this instance, silicon may be monocrystalline silicon, polycrystalline silicon, or amorphous silicon. When the substrate 111 is a p-type conductive type, the substrate 111 contains impurities of a group III element such as boron B, gallium Ga, and indium In.

In order to form a surface of the substrate 111 as a textured surface, a texturing process is performed on the substrate 111.

When a surface of the substrate 111 is formed as a textured surface, light reflectivity at a light receiving surface of the substrate 111 decreases, and an incidence and reflection operation is performed in a textured surface, and thus, light is sustained within the solar cell, and thus, an absorption rate of light increases.

Therefore, an efficiency of a solar cell is improved. In addition, reflection loss of light incident to the substrate 111 decreases, and thus, a quantity of light applied to the substrate 111 further increases.

The emitter 112 is an area in which impurities of a second conductive type, for example, an n-type conductive type opposite to a conductive type of the substrate 111 are doped, and which forms a p-n junction with the substrate 111.

When the emitter 112 is an n-type conductive type, the emitter 112 is formed by doping impurities of a group V element such as phosphorus P, arsenic As, and antimony Sb to the substrate 111.

Accordingly, when electron-hole pairs are generated within a semiconductor that receive energy by light incident to the substrate 111, electrons move toward an n-type semiconductor and holes moves toward a p-type semiconductor. Therefore, when the substrate 111 is a p-type semiconductor and the emitter 112 is an n-type semiconductor, separated holes move toward the substrate 111 and separated electrons move toward the emitter 112.

Alternatively, the substrate 111 may be an n-type conductive type and may be made of other semiconductor materials other than silicon. When the substrate 111 is an n-type conductive type, the substrate 111 may contain impurities of a group V element such as phosphorus P, arsenic As, and antimony Sb.

Because the emitter 112 forms a p-n junction with the substrate 111, when the substrate 111 is an n-type conductive type, the emitter 112 is a p-type conductive type. In this instance, separated electrons move toward the substrate 111 and separated holes move toward the emitter 112.

When the emitter 112 is a p-type conductive type, the emitter 112 is formed by doping impurities of a group III element such as boron B, gallium Ga, and indium In in to the substrate 111.

The reflection prevention film 115 formed with a silicon nitride film (SiNx), a silicon oxide film ($SiO_2$), or a titanium dioxide film ($TiO_2$) is formed on the emitter 112 of the substrate 111. The reflection preventing film 115 reduces reflectivity of light incident to the solar cell 110 and increases selectivity of a particular wavelength area or band, thereby enhancing an efficiency of the solar cell 110. The reflection prevention film 115 may have a thickness of about 70 nm to 80 nm and may be omitted, as needed or desired.

A plurality of front electrodes 113 referred to as a finger electrode are formed on the emitter 112, are electrically connected to the emitter 112, and are formed in one direction in a separated state from adjacent front electrodes 113. Each front electrode 113 collects electric charges, for example, electrons that move toward the emitter 112.

The plurality of front electrodes 113 are made of at least one conductive material, and the conductive material may be at least one selected from a group consisting of nickel (Ni), copper (Cu), silver (Ag), aluminum (Al), tin (Sn), zinc (Zn), indium (In), titanium (Ti), and gold (Au), and a combination thereof. The conductive material may be made of another conductive material.

For example, the front electrode 113 may be formed with a paste containing silver (Ag) (silver paste or Ag paste). In this instance, the front electrode 113 is electrically connected to the emitter 112 in a process of coating the silver paste on the reflection prevention film 115 using a screen print process, and firing the substrate 111 in a temperature of about 750° C. to 800° C.

In this instance, in the firing process, as an etching ingredient included in the Ag paste etches the reflection preventing film 115, silver particles contacts with the emitter 112, and thus, the above-described electrical connection is performed or obtained. In this instance, the etching ingredient may be lead oxide.

At least two current collectors 114 may be formed in a direction intersecting the front electrode 113 on the emitter 112 of the substrate 111.

The current collector 114 is made of at least one conductive material and is electrically and physically connected to the emitter 112 and the front electrode 113. Therefore, the current collector 114 outputs electric charges, for example, electrons transferred from the front electrode 113, to an external device.

A conductive material for the current collector 114 may be metal, and may be at least one selected from the group consisting of nickel (Ni), copper (Cu), silver (Ag), aluminum (Al), tin (Sn), zinc (Zn), indium (In), titanium (Ti), and gold (Au), and a combination thereof, but may be made of another conductive material.

The current collector 114 patterns the conductive material on the reflection preventing film 115 and is electrically connected to the emitter 112 in a process of firing the conductive material, as in the front electrode 113.

In this instance, a surface of the current collector 114 may be formed as an uneven surface having a plurality of unevenness, or may be formed as a flat surface. The front electrode 113 may be also formed in an uneven surface or a flat surface, similarly to the current collector 114.

The back electrode 116 is formed on a second surface of the substrate 111, i.e., on a back surface of the substrate 111, and comprises a plurality of openings 116a that expose portions of the back surface of the substrate 111. The back electrode 116 collects electric charges, for example, holes moving toward the substrate 111.

The back electrode 116 is formed on the entire second surface of the substrate 111, except for a portion at which the current collector 117 is positioned, or is formed on the entire second surface of the substrate 111, except for a portion at which the current collector 117 is positioned and a border portion.

The back electrode 116 is made of at least one conductive material. The conductive material may be at least one selected from a group consisting of nickel (Ni), copper (Cu), silver (Ag), aluminum (Al), tin (Sn), zinc (Zn), indium (In), titanium (Ti), and gold (Au) and a combination thereof, but may be made of another conductive material. For example, the back electrode 116 is made of aluminum (Al).

The current collector 117 is positioned at a back surface of the substrate 111 exposed through the opening 116a of the back electrode 116. The current collector 117 is formed in a direction intersecting the front electrode 113. That is, the current collector 117 for the back electrode 116 is formed in the same direction as that of the current collector 114 for the front electrode 113.

The current collector 117 is also made of at least one conductive material and is electrically connected to the back electrode 116. Therefore, the current collector 117 outputs electric charges, for example, holes transferred from the back electrode 116, to an external device.

The conductive material constituting the current collector 117 may be metal, and may be at least one selected from the group consisting of nickel (Ni), copper (Cu), silver (Ag), aluminum (Al), tin (Sn), zinc (Zn), indium (In), titanium (Ti), and gold (Au), and a combination thereof, but may be made of another conductive material. Preferably, but not necessarily, the current collector 117 is made of a material, for example, silver (Ag) different from a material of the back electrode 116.

The back electrode 116 and the current collector 117 are formed in different thicknesses.

For example, a thickness T1 of the current collector 117 may be formed in a thickness smaller than a thickness T2 of the back electrode 116. In this instance, a difference T2−T1 between a thickness T2 of the back electrode 116 and a thickness T1 of the current collector 117 may be 5 μm to 25 μm.

According to such a structure, because a use amount of silver (Ag) that is more expensive than aluminum (Al) can be reduced, a production cost of a solar cell module can be reduced.

A conductive adhesive film 160 is positioned on the current collector 114 in a direction parallel to the current collector 114 on the emitter 112 of the substrate 111. Further, the conductive adhesive film 160 is also positioned at the current collector 117 of the substrate 111.

FIG. 4 illustrates that one conductive adhesive film 160 is each positioned at a front surface and a back surface of the substrate 111, and the conductive adhesive films 160 of the same number as that of the interconnector 120 are each positioned at a front surface and a back surface of the substrate 111.

The conductive adhesive film 160 comprises a resin 162 and a plurality of first conductive particles 164 dispersed in the resin 162, as shown in FIG. 6. A material having adhesive strength for use as a material of the resin 162 is not particularly limited. A thermosetting resin may be used in order to enhance adhesion reliability.

The thermosetting resin may use at least one resin selected from an epoxy resin, a phenoxy resin, an acryl resin, a polyimide resin, and a polycarbonate resin.

The resin 162 may contain a hardener and a hardening accelerator as additional ingredients. For example, in order to improve adhesive strength between the current collector 114 and the interconnector 120 and between the current collector 117 and the interconnector 120, the resin 162 may contain a reforming material, such as a silane-based coupling agent, a titanate-based coupling agent, and an aluminate-based coupling agent.

Further, in order to improve a dispersion property of the first conductive particle 164, the resin 162 may contain a dispersing agent such as calcium phosphate or calcium carbonate, and in order to control an elastic modulus, the resin 162 may contain a rubber ingredient such as acrylic rubber, silicon rubber, and urethane.

A material having conductivity for use as a material of the conductive particle 164 is not particularly limited.

As shown in FIG. 6, the conductive particle 164 may be made of radial metal particles of various sizes. In this instance, a 'radial metal particle' is a metal particle in which a plurality of protrusions are irregularly formed at a surface of a metal particle of an approximately spherical or oval shape, and containing at least one metal selected from copper (Cu), silver (Ag), gold (Au), iron (Fe), nickel (Ni), lead (Pb), zinc (Zn), cobalt (Co), titanium (Ti), and magnesium (Mg) as a major ingredient or a component.

In order to smoothly allow for a current flow between the interconnector 120 and the current collector 117, the conductive adhesive film 160 comprises at least one of a radial metal particle of a size larger than a thickness of the resin 162.

According to such a structure, a portion of the radial metal particles which are formed to have a size larger than a thickness of the resin 162 is embedded in the current collector 117 and/or the interconnector 120.

Therefore, as a contact area between the radial metal particles and the current collector 117 and/or radial metal particles and the interconnector 120 increases, contact resistance can be reduced. When the contact resistance decreases, current flow between the current collector 117 and the interconnector 120 is smoothly performed.

The foregoing description describes the conductive particle 164 as being formed as a radial metal particle, but the conductive particle 164 may be formed with a metal coated resin particle comprising at least one metal selected from copper (Cu), silver (Ag), gold (Au), iron (Fe), nickel (Ni), lead (Pb), zinc (Zn), cobalt (Co), titanium (Ti), and magnesium (Mg) as a major ingredient or a component.

When the conductive particle 164 is formed as a metal coated resin particle, the conductive particle 164 is formed in a circular shape or an oval shape. Another shape may be used in embodiment of the invention.

The conductive particles 164 may physically be in contact with adjacent conductive particles.

After the resin 162 is cured, in view of adhesion reliability, an amount or (a compound amount) of the conductive particles 164 dispersed within the resin 162 is 0.5 volume % to 20 volume % of an entire volume of the conductive adhesive film 160.

If the compound amount of the conductive particle 164 is less than 0.5 volume %, physical contact points with the current collector 114 decreases, and thus, a current flow may not be smoothly performed, and if the compound amount exceeds 20 volume %, a relative amount of the resin 162 decreases, and thus, adhesive strength may deteriorate.

The conductive adhesive film 160 is adhered to the current collector 114 in a direction parallel to the current collector 114 and is adhered to the current collector 117 in a direction parallel to the current collector 117.

In this instance, a tabbing operation comprises pre-bonding the conductive adhesive film 160 to the current collector 114 and the current collector 117 of a solar cell and final-bonding the interconnector 120 and the conductive adhesive film 160.

When a tabbing operation is performed using the conductive adhesive film 160, a heating temperature and a pressing pressure are not particularly limited within ranges that can secure an electrical connection and sustain adhesive strength.

For example, the heating temperature of the pre-bonding operation may be set to about 100° C. or less, and the heating temperature of the final-bonding operation may be set to a temperature range, for example, 140° C. to 180° C. in which the resin 162 is cured.

The pressing pressure of the pre-bonding operation may be set to about 1 MPa, and the pressing pressure of the final-bonding operation may be set to a pressure range, for example, about 2 MPa to 3 MPa in which the current collector 114, the current collector 117, and the interconnector 120 fully closely contact with the conductive adhesive film 160.

In this instance, the pressing pressure is set so that at least a portion of a conductive particle is sustained at (or penetrate into) the inside of the current collectors 114 and 117 and/or the interconnector 120.

Further, a heating and pressing time of the pre-bonding operation may be set to about 5 seconds, and a heating and pressing time of the final-bonding operation may be set to a time range, for example, about 10 seconds in which the current collector 114, the current collector 117, and the interconnector 120 are not damaged or deteriorated by heat.

During the pre-bonding operation and final-bonding operation, substrate bowing may occur due to an applied heat.

For a comparison of a tabbing method according to an embodiment of the invention using a conductive adhesive film and a conventional tabbing method using hot air, a result of a substrate bowing amount is measured according to a thickness of the substrate, so that when a thickness of the substrate is 200 μm, for a convention al tabbing mode of melting a flux using hot air, a substrate bowing amount is about 2.1 mm or more, but for a tabbing mode using a conductive adhesive film of an embodiment of the invention, a substrate bowing amount is about 0.5 mm.

Here, a thickness of the substrate 111 refers to a thickness from the back surface of the substrate to the emitter, and the bowing amount refers to a height difference between a central portion of the substrate and a peripheral portion of the substrate in a lower surface of the substrate.

Substrates having a thinner thickness have an increased substrate bowing phenomenon. For example, when a thickness of the substrate 111 is 80 µm, a bowing amount of the substrate is about 14 mm or more according to a conventional tabbing method of melting a flux using hot air, but a bowing amount of the substrate is about 1.8 mm according to a tabbing method using a conductive adhesive film according to an embodiment of the invention.

Accordingly, the substrate bowing amount generated when a thickness of the substrate is 80 µm for a tabbing method according to an embodiment of the invention using a conductive adhesive film and the substrate bowing amount generating when a thickness of the substrate is 200 µm for a conventional example using hot air are similar.

When the substrate bowing amount overpasses a predetermined range, for example 2.5 mm, in a lamination process to be performed later, there is a problem in that, when using a conventional tabbing method, a crack occurs in the substrate or a bubble occurs within a module, and thus, it is impossible to form a thickness of the substrate to be thin.

However, in a tabbing method using a conductive adhesive film, because the substrate bowing amount can be remarkably reduced, compared with a conventional method, the substrate of a thin thickness can be used.

For example, when a tabbing method using a conductive adhesive film is used, a thickness of the substrate 111 may be formed to be 80 µm to 180 µm. As a thickness of the substrate decreases, a material cost can be reduced, and thus, it is preferable but not necessary that in the embodiment of the invention using a conductive adhesive film, a thickness of the substrate 111 is formed to be 180 µm or less.

The conductive adhesive film 160 comprises a first portion 160a contacting the current collector 117 and a second portion 160b contacting the back electrode 116.

In a first embodiment described with reference to FIGS. 4 to 7, a width W2 of the conductive adhesive film 160 is formed equally to a width W1 of the current collector 117, and a length L2 of the conductive adhesive film 160 is formed longer than a length L1 of the current collector 117.

Therefore, the second portion 160b of the conductive adhesive film 160 is positioned at the outside of the current collector 117 in a length direction of the current collector 117.

A thickness T3 of the first portion 160a is formed equally to a thickness T4 of the second portion 160b.

Figure 8:
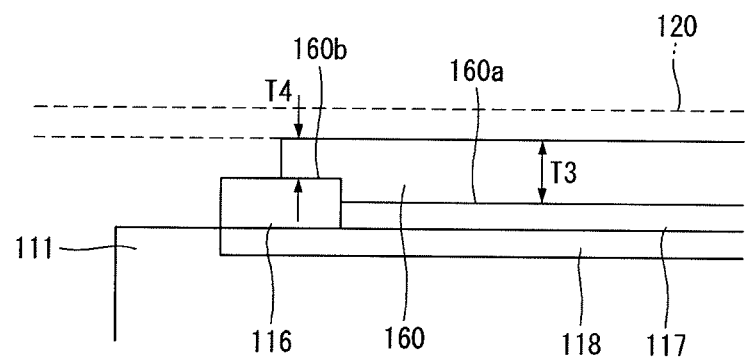
FIG. 8 is a cross-sectional view illustrating a modified example of FIG. 7 according to an embodiment of the invention.

Alternatively, as shown in FIG. 8, the thickness T3 of the first portion 160a and the thickness T4 of the second portion 160b may be different.

If a thickness T1 of the current collector 117 is formed smaller than a thickness T2 of the back electrode 116, a thickness T3 of the first portion 160a contacting the current collector 117 is formed greater than a thickness T4 of the second portion 160b contacting the back electrode 116.

In this instance, when a difference T2-T1 between the thickness T2 of the back electrode 116 and the thickness T1 of the current collector 117 is formed as 5 µm to 25 µm, a difference T3-T4 between the thickness T3 of the first portion 160a of the conductive adhesive film 160 and the thickness T4 of the second portion 160b is also formed as 5 µm to 25 µm.

According to such a structure, as shown in FIGS. 7 and 8, the conductive adhesive film 160 is filled even in a portion in which a step occurs between the back electrode 116 and the current collector 117.

Figure 9:
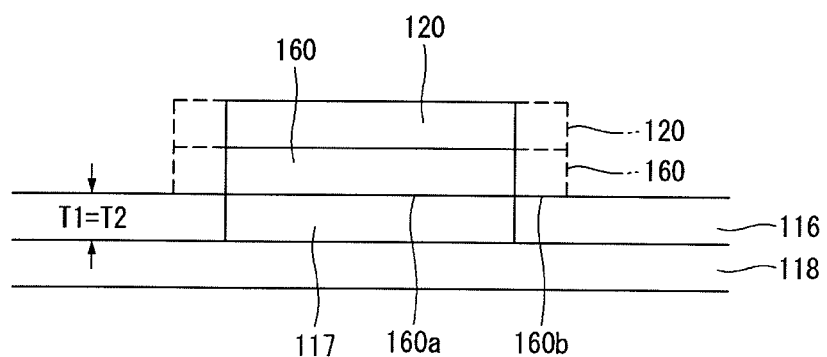
FIG. 9 is a cross-sectional view illustrating an assembly state of a back surface of a substrate in a solar cell panel according to a second example embodiment of the invention.

FIG. 9 is a cross-sectional view illustrating an assembly state of a back surface of a substrate in a solar cell panel according to a second embodiment of the invention.

This embodiment is different from the first embodiment in that a thickness T1 of the current collector 117 is formed equal to a thickness T2 of the back electrode 116.

In this instance, a width of the conductive adhesive film 160 may be formed equally to that of the current collector 117, as indicated by a solid line, and a width of the conductive adhesive film 160 may be formed greater than that of the current collector 117, as indicated by a dotted line. A width of the interconnector 120 may be formed equally to that of the conductive adhesive film 160.

When a width of the conductive adhesive film 160 is formed equal to that of the current collector 117, the second portion 160b of the conductive adhesive film 160 can be positioned at the outside of the current collector 117 in a length direction of the current collector 117, as shown in FIGS. 7 and 8.

However, when a width of the conductive adhesive film 160 is formed greater than that of the current collector 117, the second portion 160b of the conductive adhesive film 160 is positioned at the outside of the current collector 117 in a length direction of the current collector 117, as shown in FIGS. 7 and 8, and is positioned at the outside of the current collector 117 in a width direction of the current collector 117, as shown in FIG. 9.

Figure 10:
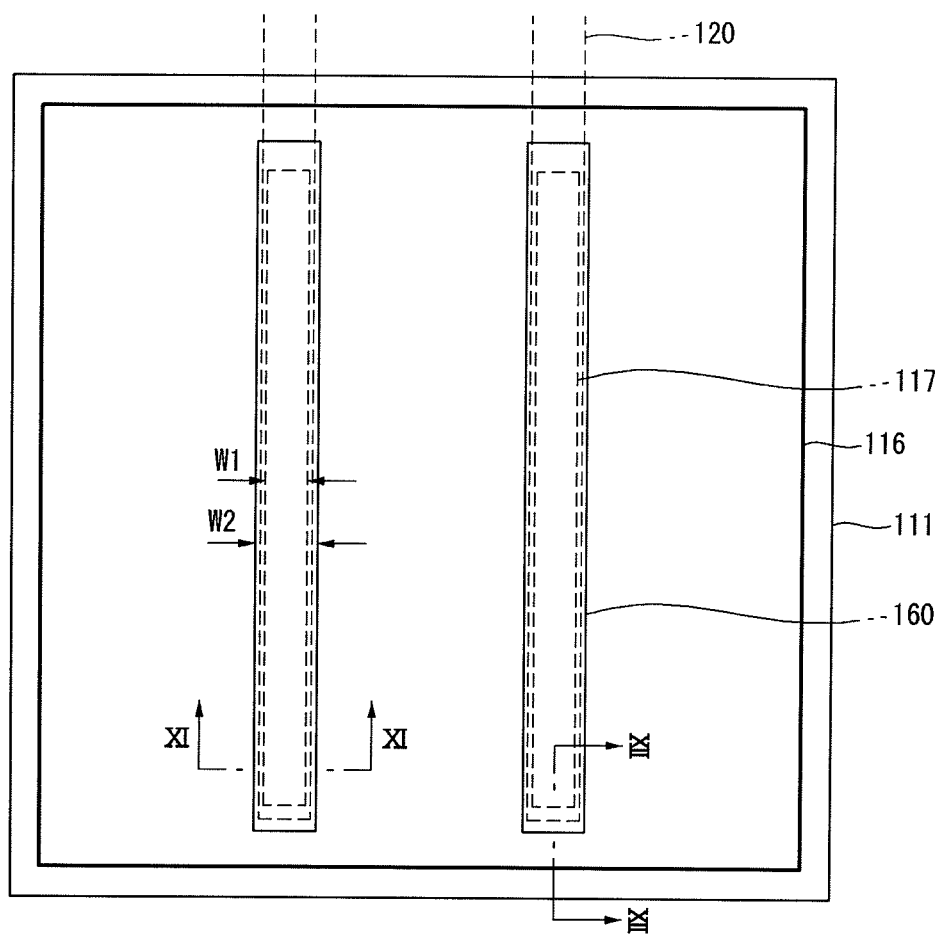
FIG. 10 is a top plan view illustrating an assembly state of a back surface of a substrate in a solar cell panel according to a third example embodiment of the invention.
Figure 11:
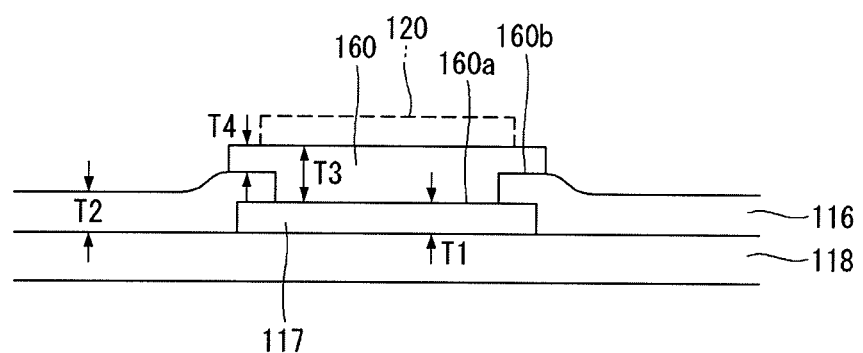
FIG. 11 is a cross-sectional view illustrating the back surface of the substrate taken along line XI-XI of FIG. 10 according to an embodiment of the invention.
Figure 12:
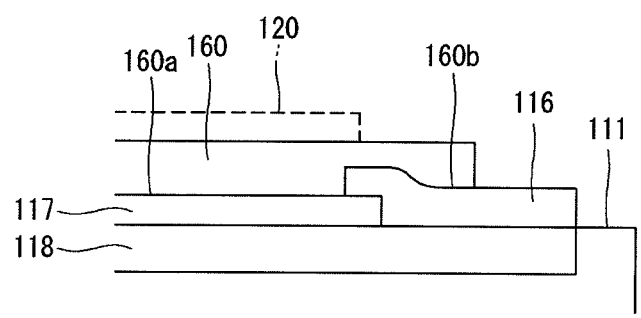
FIG. 12 is a cross-sectional view illustrating the substrate back surface taken along line XII-XII of FIG. 10 according to an embodiment of the invention.

FIG. 10 is a top plan view illustrating an assembly state of a back surface of a substrate in a solar cell panel according to a third embodiment of the invention, FIG. 11 is a cross-sectional view illustrating the back surface of the substrate taken along line XI-XI of FIG. 10 according to an embodiment of the invention, and FIG. 12 is a cross-sectional view illustrating the back surface of the substrate taken along line XII-XII of FIG. 10 according to an embodiment of the invention.

After a plurality of back electrodes 116 are first formed (or attached) at a back surface of the substrate 111, and when the current collector 117 as shown in FIGS. 10 to 12 is disposed thereon, it is preferable but not necessary that a portion of the back electrode 116 is formed to cover a portion of the current collector 117. That is, it is preferable but not necessary that a portion of the back electrode 116 is formed to overlap with a portion of the current collector 117. According to such a structure, electric charges collected at the back electrode 116 are further effectively transferred to the current collector 117.

In a solar cell of such a structure, a width W2 of the conductive adhesive film 160 may be formed to be greater than a width W1 of the current collector 117, and a thickness T3 of the first portion 160a of the conductive adhesive film 160 may be formed greater than a thickness T4 of the second portion 160b.

As shown in FIGS. 10 and 11, a width of the interconnector 120 is formed smaller than that of the conductive adhesive film 160. In this instance, a width of the interconnector 120 may be greater than or equal to that of the current collector 117. In this instance, a width of the interconnector 120 is a gap between long sides of the interconnector 120.

As shown in FIGS. 10 and 12, one end portion of the interconnector 120 is positioned to end prior to an end portion of the conductive adhesive film 160.

According to such a structure for the conductive adhesive film 160, a portion of one end in a length direction and a portion of both corners in a width direction of the conductive adhesive film 160 are not covered by the interconnector 120.

According to such a structure of the conductive adhesive film 160, the second portion 160*b* of the conductive adhesive film 160 is positioned at the outside of the current collector 117 in a length direction of the current collector 117, as described in the foregoing embodiments. Further, the second portion 160*b* of the conductive adhesive film 160 is positioned at the outside of the current collector 117 in a width direction of the current collector 117. Also, the portion of the back electrode 116 formed to overlap with a portion of the current collector 117 is interposed between the current collector 117 and the second portion 160*b* of the conductive adhesive film 160. In such an instance, a width of the conductive adhesive film 160 may be about the same as a width of the current collector 117, or the width of the conductive adhesive film 160 may be greater than the width of the current collector 117.

In the foregoing description, a connection structure of the current collector 117, the conductive adhesive film 160, and the interconnector 120 are described, but the foregoing description can be equally applied to a connection structure of the current collector 114, the conductive adhesive film 160, and the interconnector 120.

When the conductive adhesive film 160 of the foregoing structure is used, even if the interconnector 120 is made of a leadless material, bonding between the interconnector 120 and the current collector 114 and between the interconnector 120 and the current collector 117 is well performed.

Further, bonding between the interconnector 120 and the back electrode 116 made of aluminum is well performed.

Therefore, because electric charges are transmitted through the second portion 160*b* contacting with the back electrode 116 as well as the first portion 160*a* of the conductive adhesive film 160, a current collection efficiency is improved.

In the foregoing description, an instance where a thickness of the back electrode is formed greater than that of the current collector for the back electrode, or an instance where a thickness of the back electrode is formed equal to that of the current collector for the back electrode is described, but even in an instance where a thickness of the back electrode is formed smaller than that of the current collector for the back electrode, a tabbing operation using a conductive adhesive film can be performed.

What is claimed is:

1. A solar cell module comprising:
a plurality of solar cells, each solar cell comprising a substrate, a back electrode comprising a plurality of openings that expose portions of a back surface of the substrate and positioned at the back surface of the substrate, and a back electrode current collector positioned at a location of at least one of the plurality of openings;
a plurality of interconnectors for electrically connecting adjacent solar cells; and
a conductive adhesive film positioned between an interconnector of the plurality of interconnectors and the back electrode current collector, and electrically connecting the interconnector and the back electrode current collector,
wherein the back electrode current collector is surrounded by the back electrode in length and width directions of the back electrode current collector,
wherein lengths of the back electrode current collector and the conductive adhesive film are longer than a length of the at least one opening, or widths of the back electrode current collector and the conductive adhesive film are larger than a width of the at least one opening,
wherein a length of the conductive adhesive film is longer than a length of the back electrode current collector,
wherein the conductive adhesive film comprises a first portion directly contacting a back surface of the back electrode current collector and a second portion positioned at the outside of the back electrode current collector in the length direction of the back electrode current collector, the second portion of the conductive adhesive film directly contacting a back surface of the back electrode positioned at the outside of the back electrode current collector in the length direction of the back electrode current collector, and
wherein a portion of the back electrode is interposed between the back electrode current collector and the second portion of the conductive adhesive film.

2. The solar cell module of claim 1, wherein the back electrode and the back electrode current collector are made of different materials, and a thickness of the back electrode is greater than a thickness of the back electrode current collector.

3. The solar cell module of claim 2, wherein a difference between the thickness of the back electrode and the thickness of the back electrode current collector is 5 μm to 25 μm.

4. The solar cell module of claim 2, wherein a thickness of the first portion of the conductive adhesive film is greater than a thickness of the second portion of the conductive adhesive film.

5. The solar cell module of claim 2, wherein a thickness of the first portion of the conductive adhesive film is substantially the same as a thickness of the second portion of the conductive adhesive film.

6. The solar cell module of claim 2, wherein a width of the conductive adhesive film is greater than a width of the back electrode current collector.

7. The solar cell module of claim 6, wherein the second portion of the conductive adhesive film is further positioned at the outside of the back electrode current collector in the width direction of the back electrode current collector.

8. The solar cell module of claim 1, wherein a width of the conductive adhesive film is greater than a width of the back electrode current collector.

9. The solar cell module of claim 8, wherein a width of the interconnector is formed smaller than the width of the conductive adhesive film.

10. The solar cell module of claim 9, wherein the width of the interconnector is greater than or equal to the width of the back electrode current collector.

11. The solar cell module of claim 1, wherein the portion of the back electrode is overlapped with a portion of the back electrode current collector.

12. The solar cell module of claim 1, wherein the back electrode current collector and the conductive adhesive film have a line shape.

* * * * *